(12) United States Patent
Caesar et al.

(10) Patent No.: US 10,189,701 B2
(45) Date of Patent: Jan. 29, 2019

(54) SENSOR, FILTER ELEMENT COMPRISING A SENSOR AND USE OF SAID TYPE OF FILTER ELEMENT

(71) Applicant: Carl Freudenberg KG, Weinheim (DE)

(72) Inventors: Thomas Caesar, Weinheim (DE); Renate Tapper, Bensheim (DE); Steffen Heinz, Burgstaedt (DE); Marco Neubert, Chemnitz (DE)

(73) Assignee: CARL FREUDENBERG KG, Weinheim (DE)

( * ) Notice: Subject to any disclaimer, the term of this patent is extended or adjusted under 35 U.S.C. 154(b) by 0 days.

(21) Appl. No.: 15/500,545

(22) PCT Filed: Jul. 23, 2015

(86) PCT No.: PCT/EP2015/066877
§ 371 (c)(1),
(2) Date: Jan. 31, 2017

(87) PCT Pub. No.: WO2016/016085
PCT Pub. Date: Feb. 4, 2016

(65) Prior Publication Data
US 2017/0217763 A1    Aug. 3, 2017

(30) Foreign Application Priority Data

Aug. 1, 2014 (DE) .................. 10 2014 011 247

(51) Int. Cl.
*B81B 7/00* (2006.01)
*B81C 1/00* (2006.01)
(Continued)

(52) U.S. Cl.
CPC .......... *B81B 7/0061* (2013.01); *B81B 7/008* (2013.01); *B81C 1/0023* (2013.01); *G01L 9/0042* (2013.01); *G01L 9/0051* (2013.01); *G01L 9/0073* (2013.01); *H01L 24/16* (2013.01); *H01L 24/45* (2013.01); *B81B 2201/0264* (2013.01); *B81B 2203/0127* (2013.01); *B81B 2207/012* (2013.01); *B81B 2207/07* (2013.01);
(Continued)

(58) Field of Classification Search
CPC ............. G06F 3/044; H04R 2201/003; B81B 2201/0257; B81B 2203/0127; B81B 7/007
USPC ........................................... 257/415
See application file for complete search history.

(56) References Cited

U.S. PATENT DOCUMENTS

| 7,790,492 B1 | 9/2010 | Baumhauer, Jr. et al. |
| 2003/0025598 A1* | 2/2003 | Wolf ............... B01D 29/07 340/457.4 |

(Continued)

FOREIGN PATENT DOCUMENTS

| DE | 102009040707 A1 | 4/2011 |
| DE | 102010044616 A1 | 3/2012 |

(Continued)

*Primary Examiner* — Andy Huynh
(74) *Attorney, Agent, or Firm* — Leydig, Voit & Mayer, Ltd.

(57) ABSTRACT

A sensor has an electronic chip and a sensor chip which are arranged within a functional volume which is at the most 4-5 mm long, a maximum 2-3 mm wide, and with a maximum height of 0.5-0.8 mm, thereby provide a potentially economical filter element having a compact sensor.

1 Claim, 7 Drawing Sheets

(51) Int. Cl.
    *G01L 9/00*     (2006.01)
    *H01L 23/00*     (2006.01)

(52) U.S. Cl.
    CPC ............... *G01L 2009/0069* (2013.01); *H01L 2224/48137* (2013.01); *H01L 2224/49175* (2013.01); *H01L 2924/00014* (2013.01)

(56) References Cited

U.S. PATENT DOCUMENTS

| | | |
|---|---|---|
| 2004/0099060 A1 | 5/2004 | Kijlstra et al. |
| 2012/0266684 A1 | 10/2012 | Hooper et al. |
| 2014/0210019 A1 | 7/2014 | Nasiri et al. |
| 2017/0217763 A1 | 8/2017 | Caesar et al. |

FOREIGN PATENT DOCUMENTS

| | | |
|---|---|---|
| DE | 202013102632 U1 | 12/2013 |
| JP | 2012225925 A | 11/2012 |
| KR | 20170036081 A | 3/2017 |
| KR | 20170039700 A | 4/2017 |

\* cited by examiner

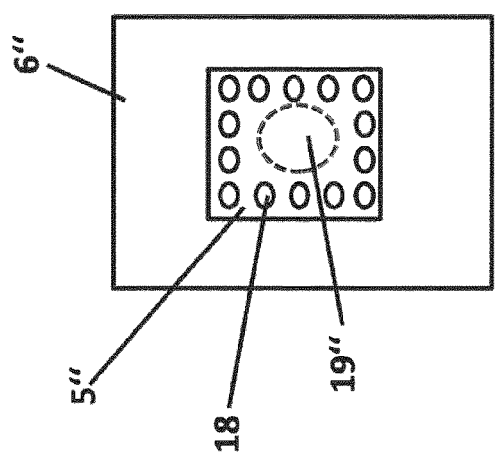

SENSOR, FILTER ELEMENT COMPRISING A SENSOR AND USE OF SAID TYPE OF FILTER ELEMENT

CROSS-REFERENCE TO RELATED APPLICATIONS

This application is a U.S. national stage application under 35 U.S.C. § 371 of International Application No. PCT/EP2015/066877, filed on Jul. 23, 2015, and claims benefit to German Patent Application No. DE 10 2014 011 247.0, filed on Aug. 1, 2014. The International Application was published in German on Feb. 4, 2016, as WO 2016/016085 A1 under PCT Article 21(2).

FIELD

The invention relates to a sensor, to a filter element comprising a sensor and to a use of a filter element comprising a sensor.

BACKGROUND

DE 10 2010 044 616 A1 discloses a micro system for a filter insert.

A filter element is already known from DE 10 2009 040 707 A1 in which a sensor is assigned to a filter medium.

A disadvantage of the known filter elements is that the sensors are often designed to be relatively large in order to detect and evaluate one or more physical variables. Manufacturing filter elements of this kind is relatively expensive. Moreover, it is more difficult to install larger sensors on filter elements.

In particular, detecting very small pressure differentials in the range of from 10 to 500 Pa is only possible in the prior art using relatively large sensors and requires a lot of installation space.

Moreover, connecting such a relatively large sensor to a filter element is very difficult and expensive. In addition, a sensor of this kind is often contacted by wire. This is especially undesirable because handling wires is laborious and unacceptable for consumers.

SUMMARY

An aspect of the invention provides a sensor, comprising: an electronic chip; and a sensor chip, wherein the electronic chip and sensor chip are arranged within a functional space which is at most 5 mm long, at most 3 mm wide, and at most 0.8 mm high.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 7 is a schematic transparent view from above of a sensor chip which is arranged on a circuit board, a plurality of contacting bumps being arranged so as to surround a diaphragm.

DETAILED DESCRIPTION

Figure 1:
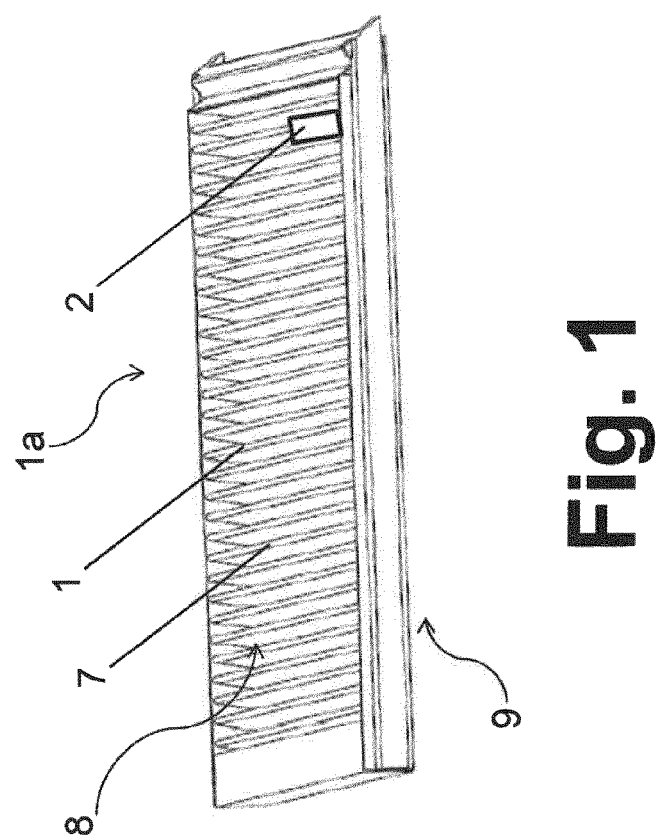
FIG. 1 shows a filter element comprising a folded filter medium, a sensor being assigned to the filter element.

An aspect of the invention is therefore that of providing a cost-effective filter element which has a compact sensor.

According to an aspect of the invention, it has firstly been identified that there is a requirement for miniaturization of a sensor in order to detect the smallest pressure differentials in the range of from 10 to 500 Pa. The clogging of a filter element can be detected using such a sensor.

It has then been identified that miniaturization and a preferably wireless, non-pluggable energy supply make it possible to integrate the sensor into a filter element in a cost-effective manner. The integration and the preferably wireless, non-pluggable energy and data transfer also do not require any additional installation outlay when using the filter elements in filter systems.

According to the an aspect of invention, it has been specifically identified that a sensor that has such a small functional space is particularly easy to install. Moreover, material can be saved when the functional space is selected to be small in this manner. In this respect, a cost-effective filter element is provided which comprises a compact sensor.

180 nm technology can be used in order to arrange electronics and a diaphragm on a sensor chip. This allows the sensor chip and thus the functional space to be compact.

A plurality of electronic chips and/or a plurality of sensor chips may be arranged within the functional space. As a result, a plurality of physical variables can be detected.

The electronic chip may have a plurality of analog and/or digital interfaces, by means of which different sensor chips can be evaluated. As a result, a single electronic chip can be combined with various sensors or sensor chips.

Wireless transmission of energy and/or data via a radio interface, in particular a RFID interface, or via a non-pluggable connection of contacts, may be possible or may occur by means of the electronic chip and/or the sensor chip. As a result, expensive wiring is no longer required.

The sensor chip comprising a transducer element and/or the sensor chip comprising a transducer element and a sensor front end may be manufactured in its entirety in a 180 nm CMOS technology process, in particular for detecting a differential pressure in the range of from 10 to 500 Pa at a resolution of 5 Pa. As a result, pressures can be measured precisely and efficiently.

Against this background, the transducer element may be designed as a transistor or resistor on a silicon diaphragm. As a result, a very reliable arrangement is produced.

The electronic chip and the sensor chip may be arranged side by side on a circuit board. This results in a very planar construction.

The electronic chip and the sensor chip may be electrically conductively interconnected by means of bonding wires. The electronic chip and the sensor chip may thus be placed very close to one another. The use of bonding wires makes simple manufacture possible since the bonding wires are attached to the sides of the chips that face away from the circuit board.

The electronic chip and the sensor chip may be electrically conductively interconnected by means of a flip-chip connection using contacting "bumps". This contacting is useful when electrical devices, specifically in particular oxide layers, arranged on a silicon substrate are facing a circuit board, and the pure silicon side of the silicon substrate is facing away from the circuit board.

The sensor chip may comprise a diaphragm and electronic devices. The sensor chip can consist of a silicon substrate on and/or in which the electronics are arranged. The sensor chip can thus be very compact. It is even conceivable that the diaphragm consists only of a silicon substrate and at least one or more transducer elements. A transducer element is preferably a doped region.

Against this background, the sensor chip may comprise a silicon substrate into which a diaphragm is etched, which, apart from transducer elements, is free of electronic devices and/or oxide layers. The transducer elements are preferably formed as n- or p-doped regions on and/or in the diaphragm. Etching the diaphragm likewise produces a compact structure of the sensor chip, since a material that is intrinsically present in the silicon substrate is used as the diaphragm. The diaphragm is therefore formed as a silicon diaphragm.

Electronics or oxide layers having a thickness of approximately 10 μm may be etched away until the silicon substrate is reached, a depth of up to 500 μm being etched into the silicon substrate on the other side, in order to produce the diaphragm.

The electronic chip and the sensor chip may be arranged on a circuit board in which a passage is formed, the passage being the only fluid-conducting access to a space which is formed or sealed by the circuit board, the sensor chip and a sealing collar surrounding the sensor chip, the space being faced by a first diaphragm surface of a diaphragm. A second diaphragm surface, which is opposite the first diaphragm surface, faces the surroundings or another chamber that is separated from the space in a fluid-tight manner. As a result, the sensor chip can measure differential pressures when different pressures act on the two diaphragm surfaces.

Figure 5:
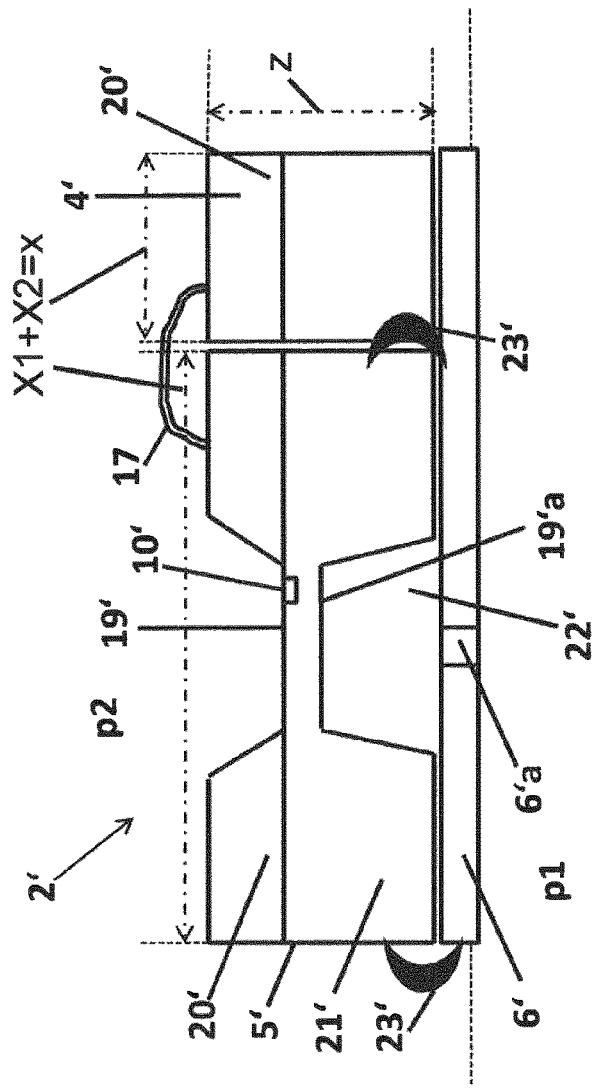
FIG. 5 is a schematic view of the sensor chip and the electronic chip, which chips are interconnected by means of bonding wires, while oxide layers or other electronic devices on a silicon substrate of the sensor chip face away from the circuit board.

The functional space in the literal sense of this document is only formed by the sums of the extensions of the electronic chips and sensor chips in the x, y and z directions. The bonding wires, the contacting bumps and/or parts of a sealing collar do not contribute to the functional space or do not increase it. In particular, the bonding wires, the contacting bumps and parts of the sealing collar protrude beyond the functional space. A part of the sealing collar arranged between an electronic chip and a sensor chip is not to be taken into account in the total extent of the functional space in the x, y or z direction. Only the dimensions of the electronic chip and sensor chip per se in the respective directions are significant. FIG. 5 shows the calculation or acquisition of the extensions x and z by way of example.

A filter element according to the invention comprises a main part, a sensor of the type described in this document being arranged on the main part.

The main part may comprise a filter medium which has an upstream side and a downstream side, the sensor chip being high-resolution such that a pressure differential between the upstream side and the downstream side in the range of from 10 to 500 Pa can be detected. As a result, pressure differentials can be precisely detected.

Against this background, the sensor chip may have a resolution of 5 Pa. The sensor chip may have a resolution in the range of from 1 Pa to less than 5 Pa. The sensor chip may have a resolution in the range of from greater than 5 Pa to 10 Pa.

Laser printers emit particles which, as particulates, can have harmful effects on human health. These particles can be separated by means of filter elements. Add-on filter elements are known which can be placed on the outlet opening of existing equipment.

Integrated activated carbon filters for ozone conversion are also known. Integrating the particle filters into equipment causes various problems. The installation space for the filter elements is limited. Said elements must be fitted into existing compact equipment structures.

The filter elements become blocked by particle deposits and need to be replaced regularly, the time of replacement depending greatly on how the piece of equipment is used, for example the type of prints and the paper used. For this reason, it is not appropriate to make a replacement within a predetermined time or counting interval.

It is thus necessary to monitor the state of a filter element. This can take place in particular by measuring a pressure differential. Conventional sensors for measuring pressure differential need to be built into the equipment.

Additional space requirements and regular maintenance, in particular cleaning or calibrating, are associated therewith. Indeed, filter elements comprising sensors for measuring pressure differential are known.

In order to evaluate the sensor data, it is necessary to connect the sensor to equipment electronics. This connection is usually made by means of a wire. A wire connection is too inconvenient when using a filter element in a laser printer, for which a simple replacement that a non-professional can carry out safely is required.

Non-pluggable connections of contacts, in particular by touch, are known from other product fields, in particular the field of printing inks for inkjet printers.

A dedusting cartridge having an integrated sensor is also known, in which data is transmitted by radio. Transmission by radio has the disadvantage that it is necessary to install a receiver unit. This involves a high space requirement and high costs.

Against this background, a filter element comprising a sensor, which permits wireless energy and/or data transmission, is used in or on a laser printer, a room air purifier, a motor vehicle, agricultural machine or construction machine. Filter elements comprising an integrated sensor and wireless energy and data transmission, in particular via a radio interface or via a non-pluggable connection of contacts, are thus used according to the invention. It is also conceivable for energy and/or data to be transmitted by wire.

It is possible that a filter element comprising electronics can be attached to a printer and that the contacting does not take place by radio but rather by touching exposed contacts. By attaching the filter element in a precisely positioned manner, the contacts of the filter element touch those on the printer.

A filter element comprising a sensor which permits energy and/or data transmission by wire or wirelessly may be used for building ventilation, in hospitals, in hygiene-related fields, in gas turbines, in compressors, for ventilating industrial processes, in drying processes in the food industry, in surface engineering, in coating processes, for filtering industrial exhaust air, for filtering in asbestos extraction, for filtering oil mist or for filtering hazardous substances.

Using a filter element of the type described in this document in the above-mentioned applications makes it possible to use a very compact sensor and in particular to measure a pressure differential in the range of from 10 to 500 Pa.

A filter element within the meaning of this description is an apparatus or an arrangement for separating particles or gaseous substances from a fluid, it being possible for particles to be solids or liquid droplets and it being possible for the fluid to be liquid or gaseous.

By way of example but not exclusively, this can be a filter element comprising a folded filter medium made of paper or nonwoven fabric, packed beds or foam structures.

The main part can be designed as bellows, as a planar filter medium, as a frame or as another component of the filter element. The sensor can therefore be arranged anywhere on the filter element.

FIG. 1 shows a filter element 1a comprising a main part 1, a sensor 2 being arranged on the main part 1.

Figure 2:
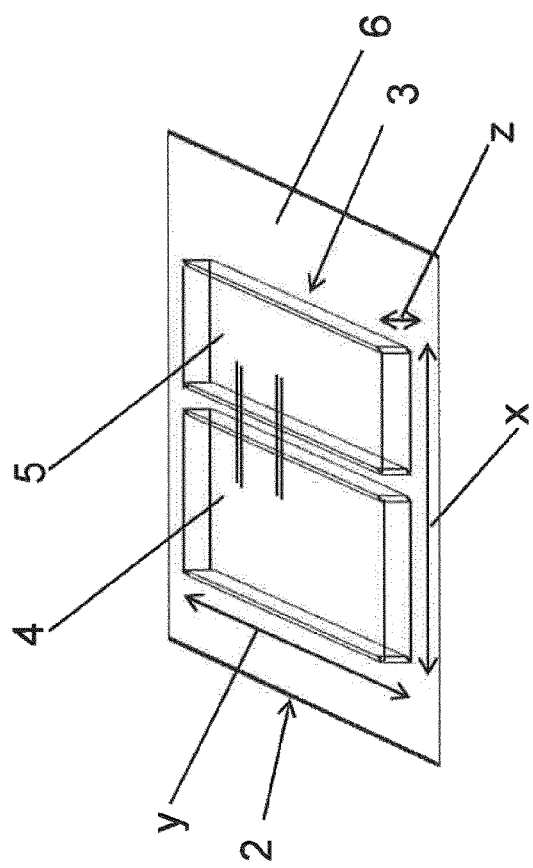
FIG. 2 is a schematic view of the sensor, the sensor comprising only two chips, specifically an electronic chip and a sensor chip, which are interconnected and define a functional space.

FIG. 2 shows that the sensor 2 comprises at least one electronic chip 4 and at least one sensor chip 5 which are arranged within a functional space 3 which is at most 4 to 5 mm long, at most 2 to 3 mm wide and at most 0.5 to 0.8 mm high.

The distance x is 5 mm, the distance y is 3 mm and the distance z is 0.8 mm.

The electronic chip 4 comprises a plurality of analog and/or digital interfaces, by means of which different sensor chips can be evaluated.

Energy and/or data are transmitted wirelessly by means of the electronic chip 4 and the sensor chip 5. This transmission can take place via a radio interface or via a non-pluggable connection of contacts.

The electronic chip 4 and the sensor chip 5 are arranged on a circuit board 6 which has a larger base than the functional space 3.

The main part 1 comprises a folded filter medium 7 which has an upstream side 8 and a downstream side 9, the sensor chip 5 being high-resolution such that a pressure differential between the upstream side 8 and the downstream side 9 in the range of from 10 to 500 Pa can be detected. The sensor chip 5 has a resolution of 5 Pa.

The filter medium 7 is produced from a nonwoven fabric. However, paper can also be used as the filter medium. The filter element 1a can comprise glued edge strips. The edge strips may have a foamed seal. The filter element 1a can be designed as a combifilter. A combifilter filters particles and gaseous materials.

Figure 3:
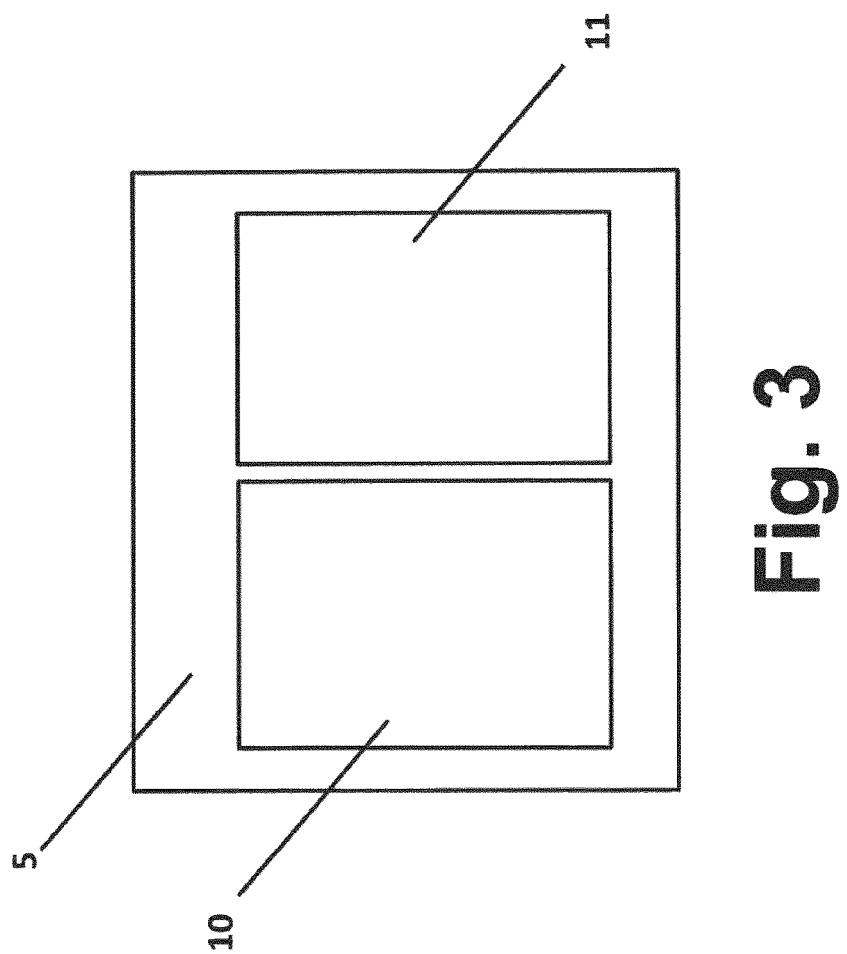
FIG. 3 is a schematic view of the sensor chip and FIG. 4 is a schematic view of the electronic chip.

FIG. 3 is a schematic view of the sensor chip 5. The sensor chip 5 makes it possible to detect a differential pressure in the range of from 10 to 500 Pa. The sensor chip 5 can consist either of only a transducer element 10 which converts a pressure change into an electrical signal, or of a transducer element 10 comprising a sensor front end 11.

The sensor chip 5 comprising a transducer element 10 and/or the sensor chip 5 comprising a transducer element 10 and a sensor front end 11 is produced in its entirety in a 180 nm CMOS technology process.

The sensor front end 11 may have electronics or be formed as such.

The transducer element 10 may be formed as a transistor or as a resistor on a silicon diaphragm.

Figure 4:
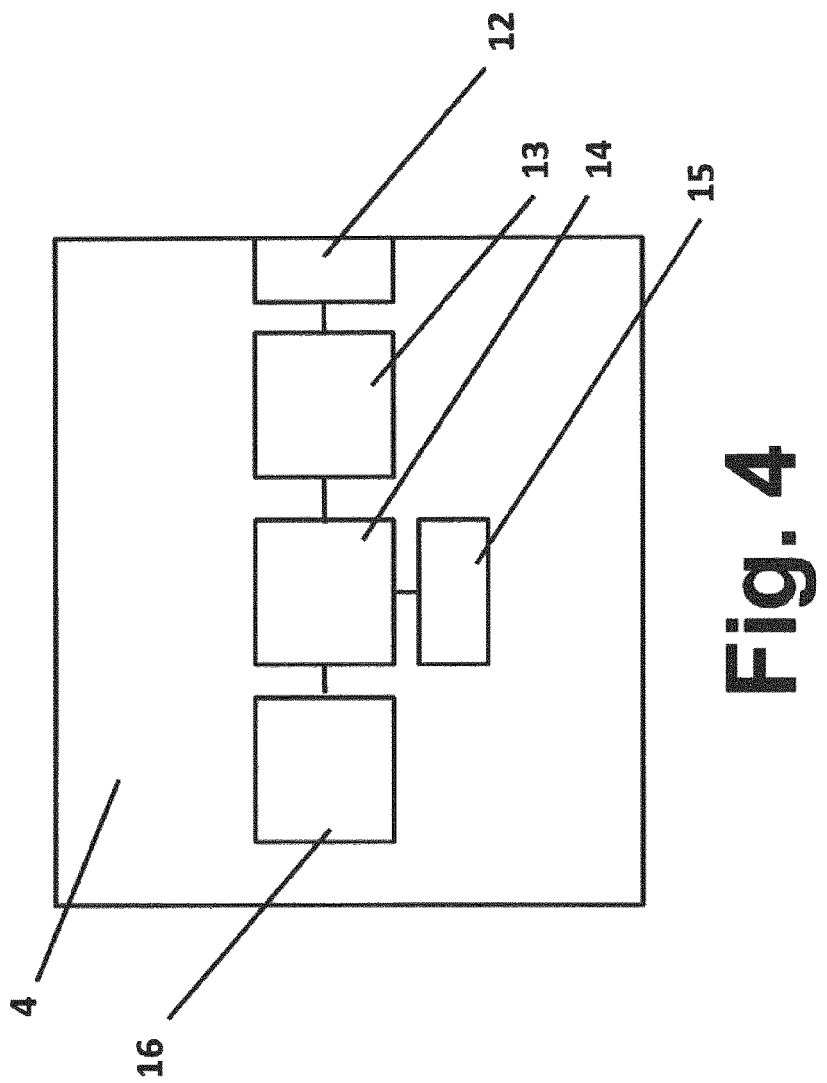

FIG. 4 is a schematic view of the electronic chip 4. The electronic chip 4 comprises analog and/or digital interfaces for connecting to additional sensors 12 or to additional sensor chips. The electronic chip 4 comprises a sensor front end 13. The electronic chip 4 comprises a microcontroller for signal processing 14. The electronic chip 4 comprises a memory 15. The electronic chip 4 comprises a RFID front end 16 for contactless supply and/or for supply via a contact connection.

FIG. 5 shows, on the basis of an additional sensor 2', that the electronic chip 4' and the sensor chip 5' are arranged side by side on a circuit board 6'. The electronic chip 4' and the sensor chip 5' are electrically conductively interconnected by means of bonding wires 17.

Figure 6:
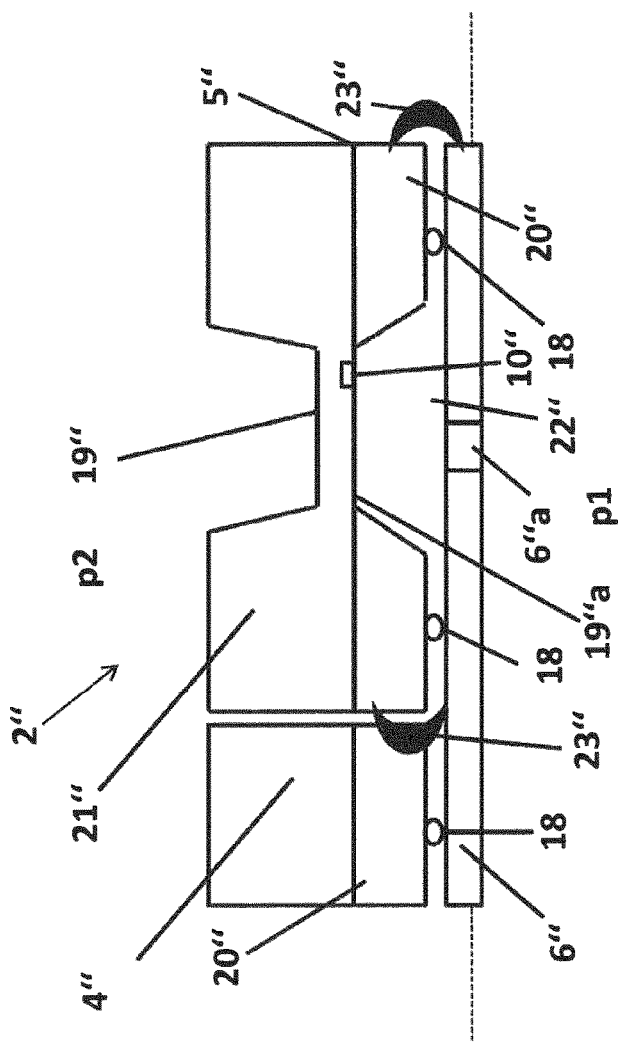
FIG. 6 is a schematic view of the sensor chip and the electronic chip, which chips are electrically conductively conducted to the circuit board and to one another by means of contacting bumps, while oxide layers or other electronic devices on a silicon substrate of the sensor chip face the circuit board.

FIG. 6 shows, on the basis of an additional sensor 2", that the electronic chip 4" and the sensor chip 5" are electrically conductively interconnected by means of a flip-chip connection by using contacting "bumps" 18.

Both in FIG. 5 and in FIG. 6, the sensor chip 5', 5" comprises a diaphragm 19', 19" and electronic devices 20', 20", which may comprise oxide layers. The sensor chip 5', 5" comprises a silicon substrate 21', 21", respectively, into which a diaphragm 19', 19" is etched, which, apart from transducer elements 10', 10", is free of electronic devices or oxide layers.

The electronic chip 4', 4" and the sensor chip 5',5" are arranged on a circuit board 6', 6" in which a passage 6'a, 6"a is formed, the passage 6'a, 6"a being the only fluid-conducting access to a space 22', 22" which is formed by the circuit board 6', 6", the sensor chip 5', 5" and a sealing collar 23', 23" surrounding the sensor chip 5', 5", the space 22', 22" being faced by a first diaphragm surface 19'a, 19"a of the diaphragm 19', 19".

The electronic chip 4', 4" is adhesively bonded. The electronic chip 4', 4" also comprises electronic devices 20', 20". The space 22', 22" is sealed only by the circuit board 6', 6", the sensor chip 5', 5" and the sealing collar 23', 23", which surrounds the sensor chip 5', 5".

Different pressures p1 and p2 prevail on two different sides of the diaphragm 19', 19". The differential pressure between the sides can be measured using the sensor 2', 2" when the two sides are separated from one another in a sealed manner and the sensor 2', 2" is arranged in a suitable manner and mounted in a sealed manner. This is shown schematically by the dot-dash line.

The sealing collar 23', 23" preferably consists of a casting compound which can also flow into small gaps in a sealing manner.

FIG. 7 is a transparent view in which the contacting bumps 18 surround a diaphragm 19". The contacting bumps 18 must be precisely attached such that the sensor chip 5" and the diaphragm 19" are simultaneously placed under mechanical stress.

An interface between the sensor chip 5, 5', 5" and the electronic chip 4, 4', 4" can be located in the functional space 3.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B, and C" should be interpreted as one or more of a group of elements consisting of A, B, and C, and should not be interpreted as requiring at least one of each of the listed elements A, B, and C, regardless of whether A, B, and C are related as categories or otherwise. Moreover, the recitation of "A, B, and/or C" or "at least one of A, B, or C" should be interpreted as including any singular entity from the listed elements, e.g., A, any subset from the listed elements, e.g., A and B, or the entire list of elements A, B, and C.

The invention claimed is:

1. A filter element, comprising:
   a main part; and
   a sensor, comprising:
   an electronic chip; and
   a sensor chip,
   wherein the electronic chip and sensor chip are arranged within a functional space which is at most 5 mm long, at most 3 mm wide, and at most 0.8 mm high,
   wherein the sensor is arranged on the main part,
   wherein the main part includes a filter medium including an upstream side and a downstream side,
   wherein the sensor chip is high-resolution such that a pressure differential between the upstream side and the downstream side in a range of from 10 to 500 Pa can be detected, and
   wherein the sensor chip has a resolution of 5 Pa.

* * * * *